(12) United States Patent
Kim et al.

(10) Patent No.: US 8,154,063 B2
(45) Date of Patent: Apr. 10, 2012

(54) ULTRAFAST AND ULTRASENSITIVE NOVEL PHOTODETECTORS

(75) Inventors: Jin Young Kim, Cambridge, MA (US); Ramses Martinez, Madrid (ES); Francesco Stellacci, Somerville, MA (US); Javier Martinez, Madrid (ES); Ricardo Garcia, Madrid (ES)

(73) Assignees: Massachusetts Institute of Technology, Cambridge, MA (US); Consejo Superior de Investigaciones Cientificas, Madrid (ES)

(*) Notice: Subject to any disclaimer, the term of this patent is extended or adjusted under 35 U.S.C. 154(b) by 150 days.

(21) Appl. No.: 12/715,783

(22) Filed: Mar. 2, 2010

(65) Prior Publication Data

US 2011/0215298 A1    Sep. 8, 2011

(51) Int. Cl.
*H01L 31/062* (2012.01)
*H01L 31/113* (2006.01)

(52) U.S. Cl. .............. 257/293; 257/295; 257/E33.076
(58) Field of Classification Search .............. 257/290, 257/293, 295, E33.076; 977/759, 938
See application file for complete search history.

(56) References Cited

U.S. PATENT DOCUMENTS

2010/0155696 A1* 6/2010 Duan et al. .............. 257/14
* cited by examiner

*Primary Examiner* — Hoai V Pham
(74) *Attorney, Agent, or Firm* — Gesmer Updegrove LLP

(57) ABSTRACT

A photodetector is provided that includes a FET structure with a channel structure having one or more nanowire structures. Noble metal nanoparticles are positioned on the channel structure so as to produce a functionalized channel structure. The functionalized channel structure exhibits pronounced surface plasmon resonance (SPR) absorption near the SPR frequency of the noble metal nanoparticles.

10 Claims, 7 Drawing Sheets

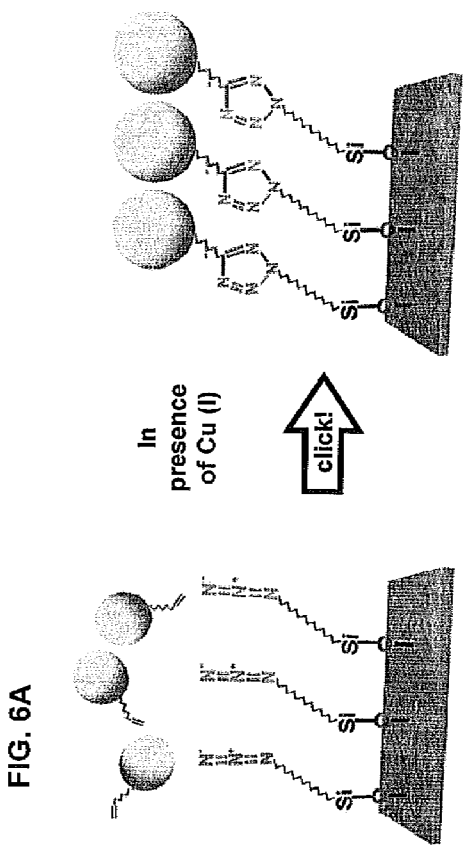
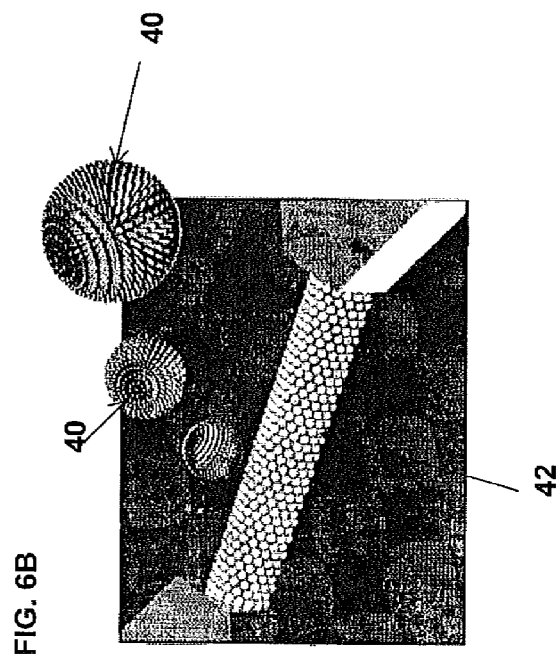
FIG. 6A
FIG. 6B

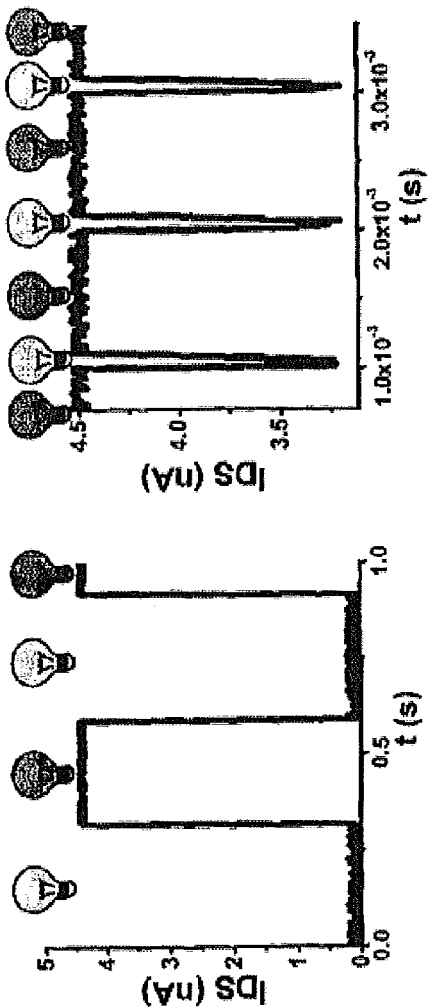
FIG. 7A
FIG. 7B
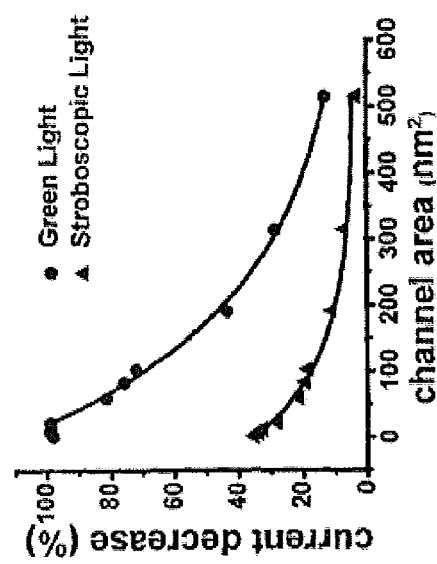
FIG. 7C

ULTRAFAST AND ULTRASENSITIVE NOVEL PHOTODETECTORS

BACKGROUND OF THE INVENTION

The invention is related to the field of photodetectors, and in particular to photodetectors having a hybrid plasmonic nanostructured arrangement.

Noble metallic nanostructures are interesting nano materials that exhibit strong optical resonance properties. Such an optical characteristic is dominated by surface plasmon generation. The phenomenon is understood to be caused by a collective oscillation of conduction electrons in the nanostructures under optical excitation and is critically dependent on the local structure and its geometry.

However, noble metallic nanostructures have not been used to form optical structures, such as photodetectors.

SUMMARY OF THE INVENTION

According to one aspect of the invention, there is provided a photodetector. The photodetector includes a field effect transistor (FET) structure with a channel structure having one or more nanowire structures. Noble metal nanoparticles are positioned on the channel structure so as to produce a functionalized channel structure. The functionalized channel structure exhibits pronounced surface plasmon resonance (SPR) absorption near the SPR frequency of the noble metal nanoparticles.

According to another aspect of the invention, there is provided an optical device. The optical device includes a FET structure with a channel structure having one or more nanowire structures. Noble metal nanoparticles are positioned on the channel structure so as to produce a functionalized channel structure. The functionalized channel structure exhibits pronounced surface plasmon resonance (SPR) absorption near the SPR frequency of the noble metal nanoparticles.

According to another aspect of the invention, there is provided a method of forming a photodetector. The method includes forming a FET structure with a channel structure having one or more nanowire structures. Also, the method includes depositing a plurality of noble metal nanoparticles on the channel structure so as to produce a functionalized channel structure. The functionalized channel structure exhibits pronounced surface plasmon resonance (SPR) absorption near the SPR frequency of the noble metal nanoparticles.

BRIEF DESCRIPTION OF THE DRAWINGS

FIG. 6A-6B are a schematic diagram illustrating the process for functionalizing silicon nanowires (Si NWs) coated with gold NPs used in accordance with the invention;

FIGS. 7A-7C are graphs illustrating photoresponse properties measured using various geometrically different samples formed in accordance with the invention.

DETAILED DESCRIPTION OF THE INVENTION

The invention is a photodetector having a hybrid plasmonic nanostructured arrangement that combines a conventional transistor with noble metal nanostructures to achieve ultrafast optical switching devices. It is based on an innovative design that is different from other photodetectors in the prior art. In particular the physical phenomena that lead to the detection of light are completely different in the invention as compared to others in the prior art.

Figure 1:
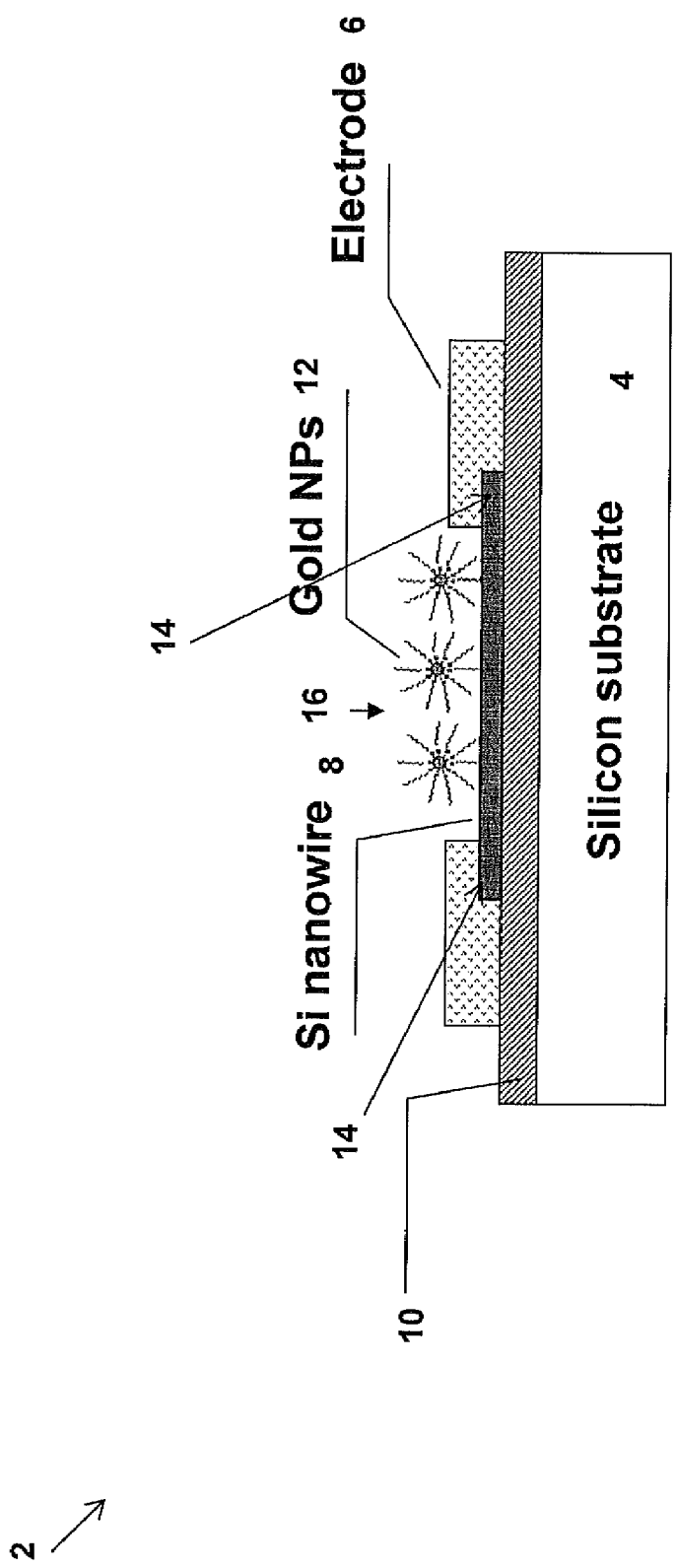
FIG. 1 is a schematic diagram illustrating a novel photodetector formed in accordance with the invention.

An example of a hybrid plasmonic nanostructured device is a photodetector 2 as shown in FIG. 1. In particular, FIG. 1 shows the photodetector 2 having a nanoscale metal-oxide-semiconductor field effect transistor (MOSFET) structure combined with noble metal nanoparticles (NPs) 12. The photodetector 2 includes a doped silicon substrate 4 and a dielectric layer 10 positioned on the substrate 4. The dielectric layer 10 can include silicon dioxide or similar materials. A channel 8 and electrodes 6 are formed on the dielectric layer 10. The channel 8 includes silicon nanowires (Si NWs) or other types of nanowire structures. Portions 14 of the channel 8 are positioned within the electrodes 6. A plurality of ligand-coated gold nanoparticles (NPs) 12 are deposited at room temperature on the Si NWs of channel 8 to produce a hybrid plasmonic nanostructure 16, which provides the optical properties necessary for optical switching. Other types of noble nanoparticles can be used instead of gold, such as silver, platinum or the like. The electrodes 6 can be designated either the source or drain of the photodetector 2.

The photodetector 2 is fabricated using local oxidation techniques used in atomic force microscopy (AFM), resulting in the channel 8 having a width of 4 nm and a height of 35 nm. In other embodiments, these dimensions can vary. The ligand-coated gold nanoparticles (NPs) 12 have a size of 3.5 nm or higher, which are deposited on the Si NWs of channel 8

The novel photodetector 2 is more sensitive than commercial photo detectors, at present one can detect 5 nW light using the photodetector 2 while commercial photodetectors do not go below 1 µW. Commercial photodetectors speed is limited by the carrier diffusion length while the invention is based on sub-nanosecond processes and hence is only limited by self-capacitance. At present, it is measured at a response of 110 ps. Importantly, the photodetector 2 can sense any wavelength for which a plasmonic nanoparticle can have resonance and this includes UV and IR (all the way to mid IR) permitting for the formation of room temperature IR photodetectors.

Figure 2:
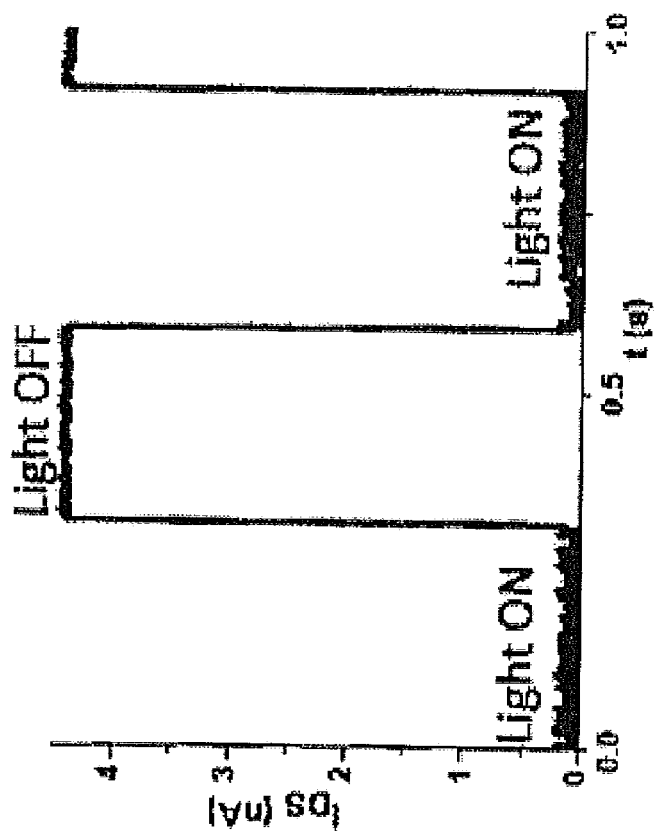
FIG. 2 is a graph illustrating the photoresponse of the novel photodetector of FIG. 1.

The inventive photodetector 2 shows novel optical switching properties. The hybrid plasmonic nanostructure 16 can exhibit pronounced surface plasmon resonance (SPR) absorption, near the SPR frequency of gold NPs. A strong wavelength-dependent and reversible photoresponse has been observed, as shown in FIG. 2. Photoresponse measurements are conducted under alternate light illumination of different wavelengths and under dark conditions. A fabricated MOSFET was also investigated under light illumination as a reference.

Figure 3:
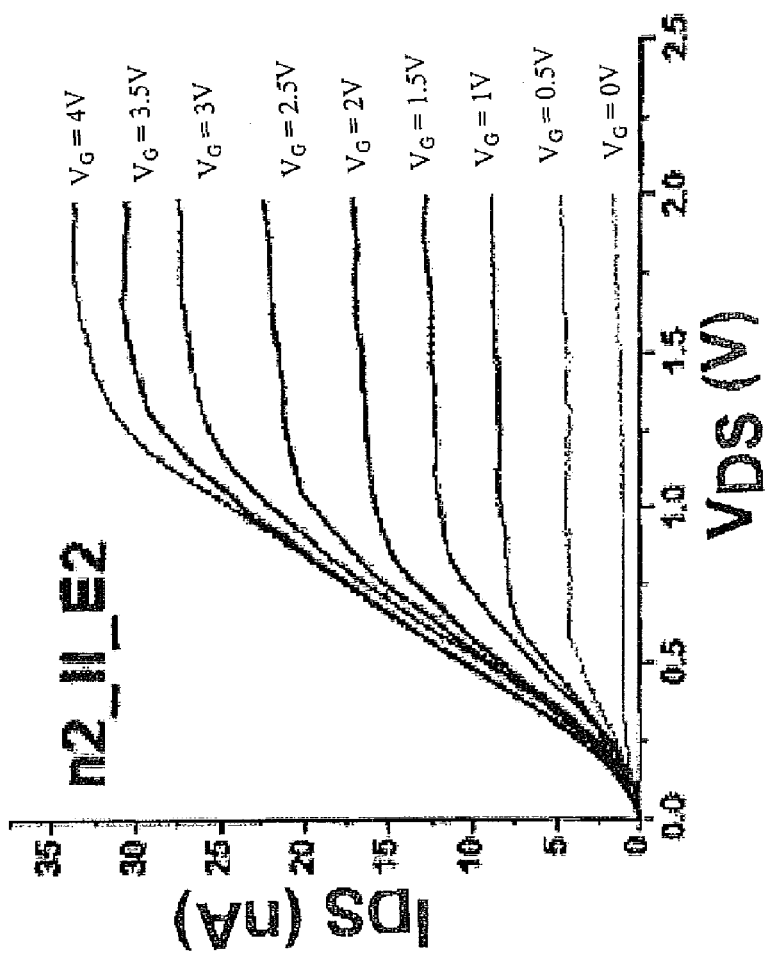
FIG. 3 is a graph illustrating the current-voltage characteristics of the novel photodetector of FIG. 1.

As shown in FIG. 3, the inventive photodetector 2 showed typical transistor properties. Additionally, a current modification is observed upon illumination and the photoresponse properties are wavelength dependent. The photoresponse behavior at a SPR wavelength shows a larger difference in current between the on and off illumination conditions. The current change is nearly several times that observed using different wavelength light. It is understood that the enhanced photosensitive behavior observed for hybrid plasmonic nanostructures can be attributed to the SPR.

The invention provides a novel technique to fabricate photodetectors at the nanoscale with a sensitivity and speed 100 times higher than other commercial photodiodes. This technique is based on the combination by the electrical transport properties of the silicon nanowires (Si NWs) and the surface plasmon resonance (SPR) of the noble-metal nanoparticles (NPs).

An Atomic Force Microscope (AFM) with additional circuits is used to apply voltage pulses to fabricate Si NWs from a commercially available p-type silicon-on-insulator (SOI) substrate 32 having a 55 nm thick Si device layer 20 on top of a 100 nm buried oxide layer. To make Si NWs, the AFM nanolithography is based on the local oxidation of the top surface 20 of the SOI 32.

Figure 4:
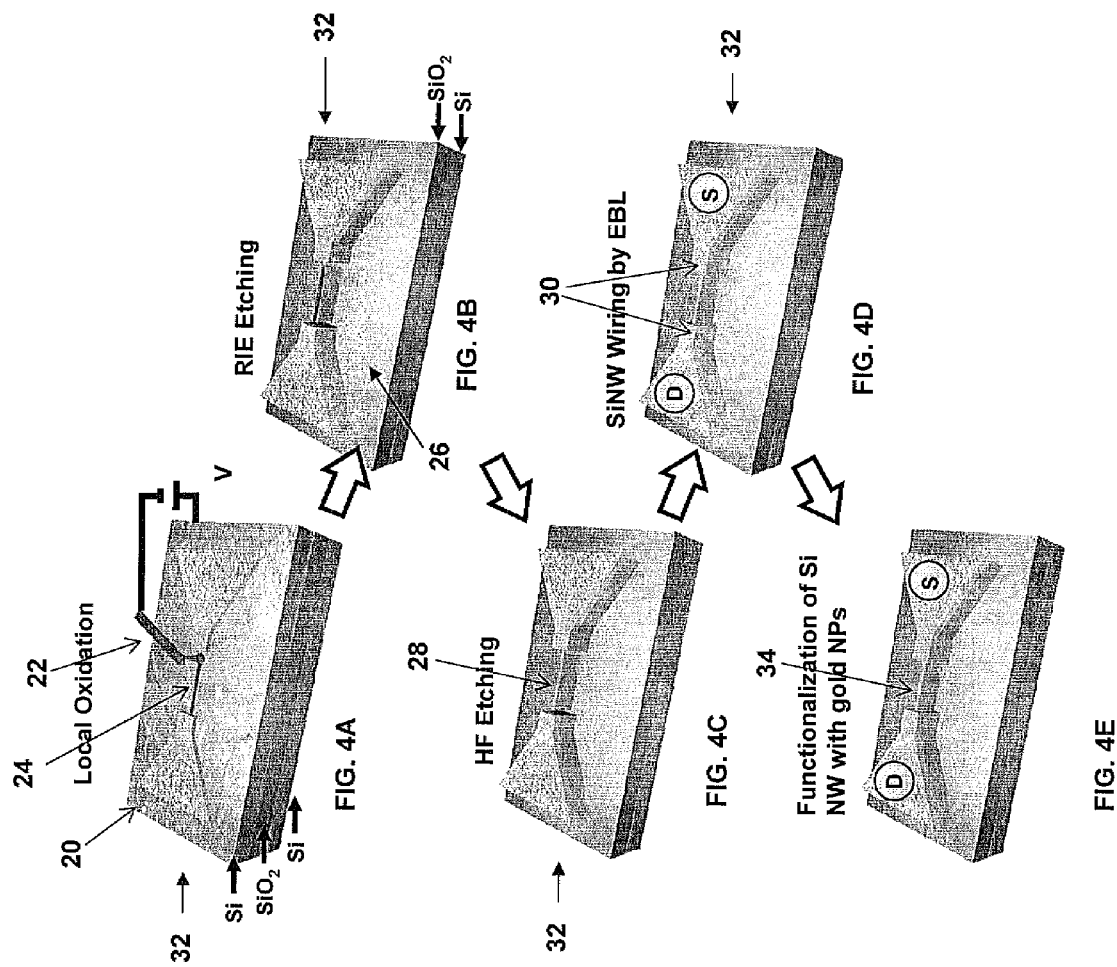
FIG. 4A-4E are schematic diagrams illustrating the process flow for fabricating the novel photodetector of FIG. 1.

In the step shown in FIG. 4A, a mask 24, a long and narrow strip of silicon dioxide, is fabricated by applying voltage pulses between the AFM silicon probe 22 and the top surface 20 of the SOI 32. The voltage pulse V induces the formation of a water meniscus and the subsequent anodic oxidation of the top surface 20. The presented nanolithography technique has a high degree of flexibility and is compatible with many integrated circuit processes.

FIG. 4B shows a step that involves the chemical etching of the unmasked silicon 26 by Reactive Ion Etching (RIE). FIG. 4C shows, after etching, the local oxide mask 28 being removed by HF and FIG. 4D shows the wiring of 30 of the Si NWs to the micrometer sized platinum or gold source (S) and drain (D) contacts using electron beam lithography. FIG. 4E shows the Si NWs being functionalized with Au NPs 34.

Figure 5:
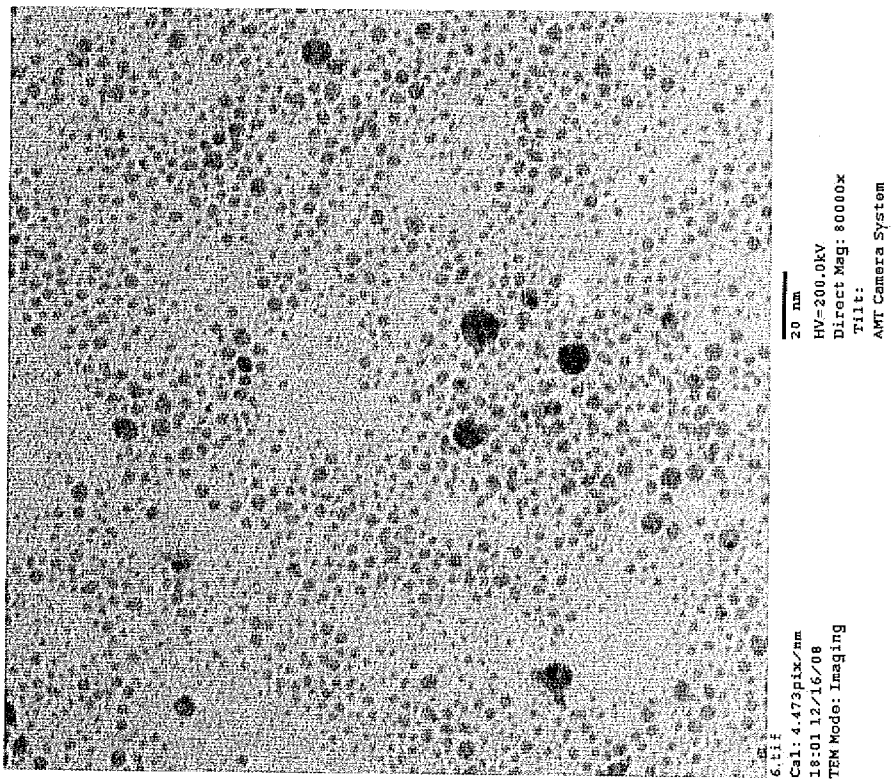
FIG. 5 is a transmission electron micrography (TEM) image of synthesized acetylene-terminated Au nanoparticles (NPs) used in accordance with the invention.

NPs synthesis was carried out in air by mixing metal sources and capping ligand in an organic solvent, such as benzene, toluene, or chloroform. Acetylene-terminated Au NPs were prepared as followings: 0.25 mmol AuPPh3Cl was mixed with 0.1 ml of acetylene-terminated thiol in 20 ml of benzene to form a clear solution to which 2.5 mmol of tert-butylamine-borane complex was then added. The reaction was done at 80° C. for 1 h. The synthesized NPs sizes are around 3.5 nm, as shown in FIG. 5.

The Au NPs functionalization on the surface of Si NWs is done by so-called "click chemistry", as shown in FIG. 6A: in this reaction the azide groups on the monolayer react with acetylene groups of a molecule of interest to form a stable triazole linkage. Here, self-assembled monolayers (SAMs) composed of acetylene-terminated groups on the surface of Au NPs reacted with azide containing groups on Si NWs via Cu(I) compound-catalyzed coupling. Also, FIG. 6B shows the Au NPs functionalization on the surface of a channel 42. These NPs 40 have a diameter of 3.5 nm passivated with acetylene-terminated thiol groups.

Photoresponse measurements based on the Si NWs MOSFET (metal oxide semiconductor FET) structures functionalized with gold NPs were conducted under alternate light illumination of different wavelengths and under dark conditions. The fabricated Si NWs under light illumination was also investigated as a reference. The fabricated Si NWs MOSFET structure without gold NPs showed no comparable fluctuation in current characteristics upon illumination.

In the case of Si NWs functionalized by Au NPs, a current modification is observed and the photoresponse properties are wavelength dependent. The photoresponse behavior at a SPR wavelength of 532 nm shows a larger difference in current between the illumination at on and off conditions. The current change is nearly five times that observed using light with different wavelengths. It is believed that the enhanced photosensitive behavior observed from the hybrid nanowires (NWs) devices can be attributed to the SPR, as the hybrid NWs devices have a pronounced SPR absorption at 532 nm.

Additionally, photoresponse properties, as shown in FIGS. 7A-7B, were measured using various geometrically different samples, as shown in FIG. 7C. One can observe that the sensitivity, on/off ratio and the speed of photoresponse properties, is remarkably increased by decreasing channel size.

The invention has many advantages relative to other commonly known photodetectors in the market and hence could be of interest to a truly large number of industry segments. A few examples for possible application of this photodetector include: inexpensive large area photodetectors for cameras; low power photodetectors for portable electronics, deep UV or infrared detectors for scientific instruments as well as military or biomedical applications.

Although the present invention has been shown and described with respect to several preferred embodiments thereof, various changes, omissions and additions to the form and detail thereof, may be made therein, without departing from the spirit and scope of the invention.

What is claimed is:

1. A photodetector comprising:
   a FET structure with a channel structure having one or more nanowire structures; and a plurality of noble metal nanoparticles positioned on the channel structure so as to produce a functionalized channel structure, said functionalized channel structure exhibiting pronounced surface plasmon resonance (SPR) absorption near the SPR frequency of said noble metal nanoparticles.

2. The photodetector of claim 1, wherein said channel structure is positioned on a dielectric layer associated with a SOI structure.

3. The photodetector of claim 2, wherein said SOI structure comprises a heavily-doped silicon wafer.

4. The photodetector of claim 1, wherein said one or more nanowires comprise silicon.

5. The photodetector of claim 1, wherein said noble metal nanoparticles comprise gold, silver, or platinum.

6. An optical device comprising:
   a FET structure with a channel structure having one or more nanowire structures; and
   a plurality of noble metal nanoparticles positioned on the channel structure so as to produce a functionalized channel structure, said functionalized channel structure exhibiting pronounced surface plasmon resonance (SPR) absorption near the SPR frequency of said noble metal nanoparticles.

7. The optical device of claim 6, wherein said channel structure is positioned on a dielectric layer associated with a SOI structure.

8. The optical device of claim 7, wherein said SOI structure comprises a doped silicon wafer.

9. The optical device of claim 6, wherein said one or more nanowires comprise silicon.

10. The optical device of claim 6, wherein said noble metal nanoparticles comprise gold, silver, or platinum.

* * * * *